United States Patent
Wen

(10) Patent No.: US 10,778,004 B2
(45) Date of Patent: Sep. 15, 2020

(54) PROTECTION CIRCUIT AND DISPLAY PANEL

(71) Applicant: Wuhan China Star Optoelectronics Semiconductor Display Technology Co., Ltd., Wuhan (CN)

(72) Inventor: Wen Wen, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 65 days.

(21) Appl. No.: 16/163,568

(22) Filed: Oct. 18, 2018

(65) Prior Publication Data

US 2019/0348836 A1 Nov. 14, 2019

Related U.S. Application Data

(63) Continuation of application No. PCT/CN2018/097480, filed on Jul. 27, 2018.

(30) Foreign Application Priority Data

May 14, 2018 (CN) .......................... 2018 1 0457136

(51) Int. Cl.
*H02H 9/04* (2006.01)
*G09G 3/3208* (2016.01)
(Continued)

(52) U.S. Cl.
CPC .......... *H02H 9/045* (2013.01); *G09G 3/3208* (2013.01); *G09G 2330/021* (2013.01);
(Continued)

(58) Field of Classification Search
CPC ........ H02H 9/045; H02H 9/04; G09G 3/3208; G09G 2330/021; G09G 2330/04;
(Continued)

(56) References Cited

U.S. PATENT DOCUMENTS

2012/0127151 A1* 5/2012 Murakami ........... G09G 3/3611
345/212
2014/0143560 A1* 5/2014 Kwon ....................... G06F 1/30
713/300

FOREIGN PATENT DOCUMENTS

CN 201256282 Y 6/2009
CN 201418037 Y 3/2010
(Continued)

*Primary Examiner* — Abhishek Sarma

(57) ABSTRACT

The present disclosure provides a protection circuit and a display panel. The protection circuit comprises: a power supply circuit for outputting a first voltage; an overvoltage protection circuit connected to the power supply circuit for feedback regulation of the first voltage, such that a first protection voltage outputted by the overvoltage protection circuit is maintained within a preset range; and an output regulator circuit connected to the overvoltage protection circuit for regulated output of a second protection voltage. Through the above embodiments, the present disclosure can always stabilize the outputted voltages within a preset range to achieve the purpose of providing a stable voltage for the display panel, thereby realizing accurate and rapid overvoltage protection of the display panel.

18 Claims, 3 Drawing Sheets

(51) Int. Cl.
*H03F 3/45* (2006.01)
*H02M 7/06* (2006.01)

(52) U.S. Cl.
CPC ........... *G09G 2330/04* (2013.01); *H02M 7/06* (2013.01); *H03F 3/45071* (2013.01); *H03F 2200/129* (2013.01); *H03F 2203/45116* (2013.01); *H03F 2203/45528* (2013.01)

(58) Field of Classification Search
CPC ............. G09G 2310/0291; G09G 3/20; G09G 2330/02; G09G 2330/028; H03F 3/45071; H03F 2200/129; H03F 2203/45528; H03F 2203/45116; H03F 2203/45521; H03F 2203/45518; H03F 3/45475; H02M 7/06; H02M 2001/325; H02M 2001/0045
See application file for complete search history.

(56) References Cited

FOREIGN PATENT DOCUMENTS

| | | |
|---|---|---|
| CN | 202384991 U | 8/2012 |
| CN | 202634297 U | 12/2012 |
| CN | 204089594 U | 1/2015 |
| CN | 104684177 A | 6/2015 |
| CN | 205160397 U | 4/2016 |
| CN | 205546049 U | 8/2016 |

* cited by examiner

PROTECTION CIRCUIT AND DISPLAY PANEL

CROSS-REFERENCE TO RELATED APPLICATIONS

The present application is a continuation-application of International (PCT) Patent Application No. PCT/CN2018/097480, filed on Jul. 27, 2018, which claims foreign priority of Chinese Patent Application No. 201810457136.3, filed on May 14, 2018 in the State Intellectual Property Office of China, the entire contents of which are hereby incorporated by reference.

TECHNICAL FIELD

The present disclosure relates to the technical field of display, and particularly to a protection circuit and a display panel.

BACKGROUND

A current OLED panel, which possesses self-luminous organic electroluminescent photodiodes requiring no backlight and has excellent properties such as high contrast, thin thickness, broad viewing angles, rapid response, applicability in a flexible panel, wide temperature applications and relatively simple construction and manufacture procedures, is considered as a next-generation flat panel display technology. Although the OLED panel has so many advantages, the OLED panel has a shorter service lifetime than an LCD panel, because the OLED panel is a current-driven self-luminous body of which the material and component lifetime have higher requirements for power supply. The current grid voltage is subjected to certain fluctuations which may cause instability or even overvoltage in the power supply. It is therefore needed to protect the circuit of the OLED panel and especially provide accurate and rapid overvoltage protection for the power supply of the OLED panel, and maintain power supply stability, thereby better protecting the display panel.

SUMMARY

The present disclosure provides a protection circuit and a display panel, which can solve the problem concerning voltage stabilizing protection of an input voltage of the display panel.

In order to solve the above problem, one technical solution adopted by the present disclosure is to provide a protection circuit including: a power supply circuit for outputting a first voltage, wherein the power supply circuit comprises a transformer, including an input terminal and an output terminal, wherein the input terminal is connected to a utility frequency power supply for performing voltage transformation of the utility frequency power supply; a rectifier, including a first input terminal, a second input terminal, a first output terminal and a second output terminal, wherein the first input terminal and the second input terminal are connected to the output terminal of the transformer for converting a voltage outputted by the transformer into a DC voltage; a filter circuit, including an input terminal and an output terminal, wherein the input terminal is connected to the first output terminal and the second output terminal of the rectifier for filtering the DC voltage; an overvoltage protection circuit connected to the power supply circuit for feedback regulation of the first voltage, such that a first protection voltage outputted by the overvoltage protection circuit is maintained within a preset range, wherein the overvoltage protection circuit comprises: a first operational amplifier circuit connected to the output terminal of the power supply circuit for performing amplifying treatment of the first voltage, and a second operational amplifier circuit connected to the first operational amplifier circuit for performing comparison feedback of the amplified first voltage, such that a first protection voltage outputted by the first operational amplifier circuit lies within preset range; and an output regulator circuit connected to the overvoltage protection circuit for regulated output of a second protection voltage.

In order to solve the above problem, another technical solution adopted by the present disclosure is to provide a protection circuit, including: a power supply circuit for outputting a first voltage, an overvoltage protection circuit connected to the power supply circuit for feedback regulation of the first voltage, such that a first protection voltage outputted by the overvoltage protection circuit is maintained within a preset range and an output regulator circuit connected to the overvoltage protection circuit for regulated output of a second protection voltage.

In order to solve the above problem, still another technical solution adopted by the present disclosure is to provide a display panel connected to a protection circuit for powering the display panel according to any one of the above methods, wherein the protection circuit comprises: a power supply circuit for outputting a first voltage; an overvoltage protection circuit connected to the power supply circuit for feedback regulation of the first voltage, such that a first protection voltage outputted by the overvoltage protection circuit is maintained within a preset range; and an output regulator circuit connected to the overvoltage protection circuit for regulated output of a second protection voltage.

The advantageous effect of the present disclosure is to provide a protection circuit and a display panel, wherein an overvoltage protection circuit is configured to perform feedback regulation of the voltage, such that the voltage is always stabilized within a preset range and is outputted via an output regulator circuit to achieve the purpose of providing a stable voltage for the display panel, thereby realizing accurate and rapid overvoltage protection of the display panel.

DETAILED DESCRIPTION

A clear and complete description of the technical solutions in the embodiments of the present disclosure will be given below in conjunction with the accompanying drawings in the embodiments of the present disclosure. Apparently, the embodiments described below are merely a part of the embodiments of the present disclosure, rather than all of the embodiments. All other embodiments obtained by a person of ordinary skill in the art without creative efforts on the basis of the embodiments of the present disclosure shall fall within the protection scope of the present disclosure.

Figure 1:
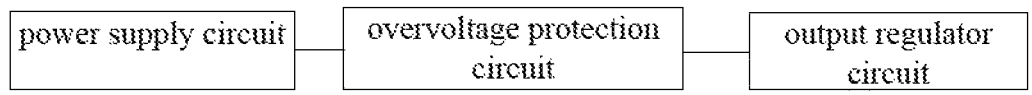
FIG. 1 is a structural diagram showing a first embodiment of a protection circuit according to the present disclosure.

Reference is now made to FIG. 1, which is a structural diagram showing an embodiment of a protection circuit according to the present disclosure. As shown in FIG. 1, a protection circuit 10 includes a power supply circuit 11, an overvoltage protection circuit 12, and an output regulator circuit 13.

Therein, the power supply circuit 11 is configured for external connection to a utility frequency voltage and outputs a first voltage.

The overvoltage protection circuit 12 is connected to the power supply circuit and is configured to perform feedback regulation of the first voltage, so that the outputted first protection voltage is maintained within a preset range.

The output regulator circuit 13 is connected to the overvoltage protection circuit for stabilizing the first protection voltage, and outputs a second protection voltage.

Figure 2:
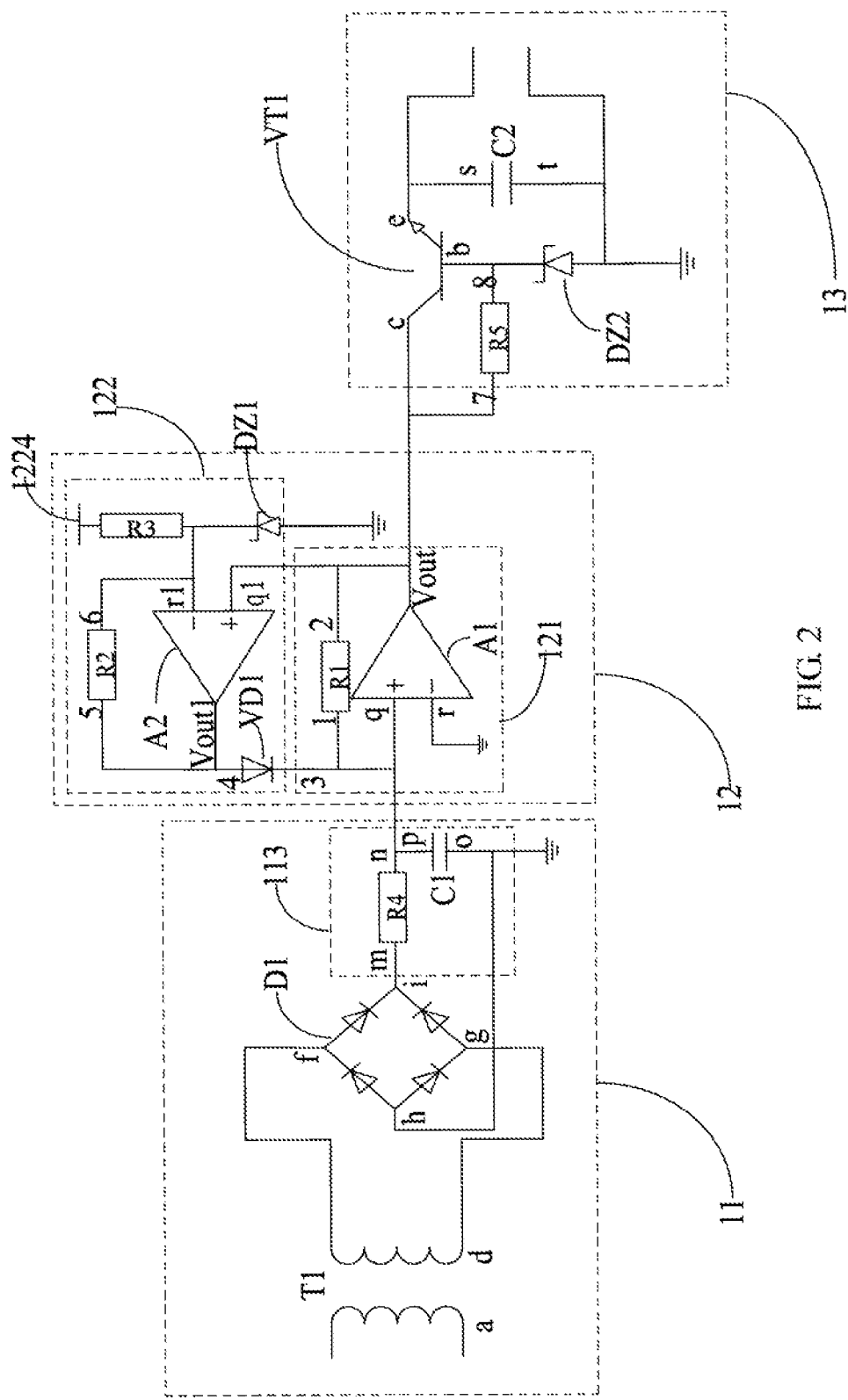
FIG. 2 is a circuit structure diagram showing a second embodiment of the protection circuit according to the present disclosure.

Reference is now specifically made to FIG. 2, which is a circuit structure diagram showing an embodiment of a protection circuit of a display panel according to the present disclosure.

As shown in FIG. 2, the power supply circuit 11 further includes a transformer T1, a rectifier D1, and a filter circuit 113.

Therein, the transformer T1 includes an input terminal a and an output terminal d. The input terminal a of the transformer T1 is a high-voltage coil terminal, and the output terminal d of the transformer T1 is a low-voltage coil terminal. The input terminal a is configured for connecting a utility frequency voltage which is generally 220V AC voltage. Through the transformer T1, the output terminal d outputs a required AC voltage, which may specifically be an operating voltage of the display panel, generally 5V, optionally 10V, etc. without any limitation herein.

The rectifier D1 is configured to convert the AC voltage outputted by the transformer T1 into a DC voltage for being outputted. The rectifier D1 in the present disclosure may be a rectifier bridge. The rectifier bridge specifically includes a first input terminal f, a second input terminal g, a first output terminal h and a second output terminal i. Therein, the first input terminal f and the second input terminal g each are connected to the output terminal d of the transformer T1; and the first output terminal h and the second output terminal i are connected to the filter circuit 113.

The filter circuit 113 is configured to filter the voltage outputted by the rectifier D1. In a specific embodiment, a voltage outputted by the rectifier D1 may have some high-frequency clutter, which will affect operation of the display panel. Thus, it is needed to filter the outputted voltage so as to eliminate the high-frequency clutter thereof. The filter circuit 113 includes an input terminal j and an output terminal k. In a specific embodiment, the filter circuit 113 can be composed of a fourth resistor R4 and a first capacitor C1. Therein, the fourth resistor R4 includes a first terminal m and a second terminal n. The first terminal m is connected to the rectifier D1, and the second terminal n is connected to an input terminal of the overvoltage protection circuit 12. The first capacitor C1 includes a first terminal o and a second terminal p. The first terminal o is grounded, and the second terminal p is connected to the second terminal n of the fourth resistor R4.

The overvoltage protection circuit 12 includes a first operational amplifier circuit 121 and a second operational amplifier circuit 122.

Therein, the first operational amplifier circuit 121, connected to an output terminal of the power supply circuit 11, is configured to receive the first voltage and perform amplifying treatment of the first voltage. The first operational amplifier circuit 121 further includes a first operational amplifier A1 and a first resistor R1. Therein, the first operational amplifier A1 includes a positive input terminal q, a negative input terminal r and an output terminal Vout. The positive input terminal q is configured to connect the output terminal of the power supply circuit 11, and the negative input terminal r is configured for being grounded. The first resistor R1 includes a first terminal 1 connected to the output terminal of the power supply circuit 11 and a second terminal 2 connected to the output terminal Vout of the first operational amplifier A1.

The second operational amplifier circuit 122 is connected to the first operational amplifier circuit 121 for feeding back the first voltage amplified and outputted by the first operational amplifier circuit 121, so that a first protection voltage outputted by the first operational amplifier circuit 121 lies within a preset range. The second operational amplifier circuit 122 further includes a second operational amplifier A2, a diode VD1 and a second resistor R2. Therein, the second operational amplifier A2 includes a positive input terminal q1, a negative input terminal r1 and an output terminal Vout1. The positive input terminal q1 is connected to the output terminal Vout of the first operational amplifier A1. The negative input terminal r1 is electrically grounded through a first voltage regulator tube DZ1, and is also connected to a power supply 1224 through a third resistor R3. The diode VD1 includes a first terminal 3 and a second terminal 4. The first terminal 3 is connected to the input terminal q of the first operational amplifier A1, and the second terminal 4 is connected to the output terminal Vout1 of the second operational amplifier A2. Current of the diode VD1 flows in a direction from the second terminal 4 to the first terminal 3. The second resistor R2 includes a first terminal 5 and a second terminal 6. The first terminal 5 is connected to the output terminal Vout1 of the second operational amplifier A2; and the second terminal 6 is connected to the negative input terminal r1 of the second operational amplifier A2.

The output regulator circuit 13 includes a triode VT1, a second capacitor C2 and a fifth resistor R5.

Therein, the triode 131 includes a collector electrode c, a base electrode b, and an emitter electrode e. The collector electrode c is connected to an output terminal of the overvoltage protection circuit 12, and the base electrode b is electrically grounded through a second voltage regulator tube DZ2. The fifth resistor R5 includes a first terminal 7 and a second terminal 8, where the first terminal 7 is connected to the collector electrode c of the triode VT1, and the second terminal 8 is connected to the base electrode b of the triode VT1. The second capacitor C2 also includes a first terminal s and a second terminal t, where the first terminal s is connected to the emitter electrode e of the triode 131, and the second terminal t is grounded.

In a specific embodiment, the principle of the entire protection circuit is as follows.

The power supply circuit 11 is configured to output a stable low-frequency low-voltage DC voltage. Specifically, a utility frequency voltage is first transformed by the transformer T1 into a low-voltage AC voltage, and the AC voltage is then converted into a DC voltage through the rectifier D1. Since the voltage outputted by the rectifier D1 may have some high-frequency clutter which will affect operation of the display panel, it is needed to filter the outputted voltage so as to eliminate the high-frequency clutter thereof. Therefore, high frequency elimination treatment is performed on the outputted voltage via the filter circuit 113, thereby deriving a first voltage. The present embodiment merely provides a circuit for supplying a low-frequency low-voltage DC voltage. In other embodiments, other power supply circuit may also be used, with no limitation set herein.

Although the first voltage is delivered into the overvoltage protection circuit 12, yet given that the utility frequency power supply has some fluctuation such that the voltage outputted by the power supply circuit 11 may be too high, a need exists for protection, which is specifically divided into the following two circumstances.

1. Under the circumstance that a value of the first protection voltage is smaller than or equal to 5V:

After the first voltage is inputted to the first operational amplifier A1, the first protection voltage is amplified and inputted via the first operational amplifier A1 and flows into the positive input terminal of the second operational amplifier A2 for comparison feedback. The negative input terminal of the second operational amplifier A2 is connected to a power supply through the third resistor R3. The power supply is 5V, and is electrically grounded through the first voltage regulator tube DZ1, so that the voltage of the negative input terminal of the second operational amplifier A2 is stabilized at 5V. When the voltage outputted by the power supply circuit 11 is smaller than or equal to 5V, the second operational amplifier A2 outputs a negative voltage; the diode VD1 is cut off; and the overvoltage protection circuit 12 lies in a voltage non-limiting state. At this time, it is unnecessary to perform limiting treatment on the voltage outputted by the power supply circuit 11.

2. Under the circumstance that a value of the first protection voltage is greater than 5V:

When the voltage outputted by the power supply circuit 11 is greater than 5V, the second operational amplifier A2 output is inverted; the diode VD1 is conducting to cause the voltage to flow to a positive input terminal of the first operational amplifier A1; and the overvoltage protection circuit 12 lies in a voltage limiting state, thereby maintaining the voltage outputted by the first operational amplifier A1 within 0V to 5V.

In the present disclosure, an overvoltage protection circuit is configured to perform comparison feedback treatment of the voltage outputted by the power supply circuit, such that the first voltage outputted by the power supply voltage is stabilized within a range of preset voltages required by the display panel, thereby making it possible to achieve accurate and rapid overvoltage protection of the display panel.

In order to further maintain the display panel in a stable operating state, the voltage outputted by the overvoltage protection circuit 12 is transmitted to the output regulator circuit 13, and the triode clamp is used to further stabilize the inputted voltage and eliminate the clutter thereof, thereby providing a stable operating voltage for the display panel.

In the above embodiment, an overvoltage protection circuit is configured to perform comparison feedback treatment of the voltage outputted by the power supply circuit, such that the protection voltage outputted by the power supply voltage is stabilized within a range of preset voltages required by the display panel, thereby making it possible to achieve accurate and rapid overvoltage protection of the display panel.

Figure 3:
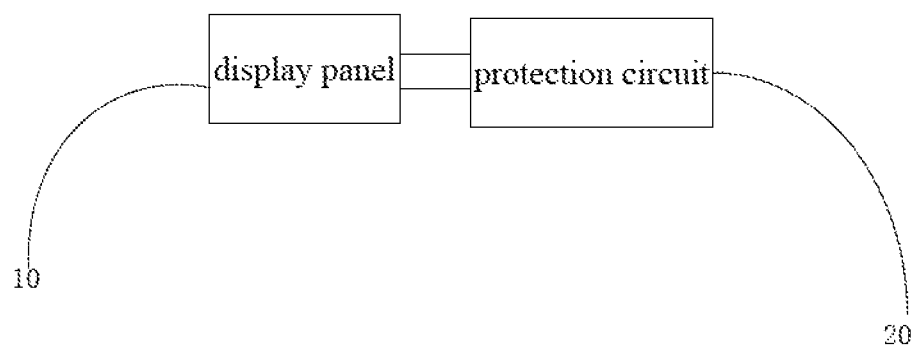
FIG. 3 is a structural diagram showing an embodiment of a display panel according to the present disclosure.

Reference is now made to FIG. 3, which is a structural diagram showing an embodiment of a display panel according to the present disclosure. A display panel 20 is included, which may specifically be an OLED panel connected to and powered by the protection circuit 10 involved in the above method. The specific structure and operating principle of the protection circuit 10 are detailed in the concrete description of the above embodiments and thus are not described herein.

In sum, those skilled in the art can easily understand that the present disclosure provides a protection circuit and a display panel, where an overvoltage protection circuit is configured to specifically perform feedback regulation of a voltage outputted by the power supply circuit, to stabilize the voltage outputted by the power supply voltage within a preset range; and the voltage is outputted via an output regulator circuit, to achieve the purpose of providing a stable voltage for the display panel, thereby realizing accurate and rapid overvoltage protection of the display panel.

The foregoing are only the implementing modes of the present disclosure, which are not intended to limit the scope of the present disclosure. Any equivalent structure or equivalent process transformation made by using the contents of the description and the accompanying drawings of the present disclosure, or directly or indirectly applied in other related technical fields, is similarly included in the protection scope of the present disclosure.

What is claimed is:

1. A protection circuit, comprising:
   a power supply circuit for outputting a first voltage, wherein the power supply circuit comprises a transformer comprising an input terminal and an output terminal, the input terminal being connected to a utility frequency power supply for performing voltage transformation of the utility frequency power supply;
   a rectifier, comprising a first input terminal, a second input terminal, a first output terminal and a second output terminal, wherein the first input terminal and the second input terminal are connected to the output terminal of the transformer for converting a voltage outputted by the transformer into a DC voltage;
   a filter circuit, comprising an input terminal and an output terminal, wherein the input terminal is connected to the first output terminal and the second output terminal of the rectifier for filtering the DC voltage;
   an overvoltage protection circuit connected to the power supply circuit for feedback regulation of the first voltage, such that a first protection voltage outputted by the overvoltage protection circuit is maintained within a preset range, wherein the overvoltage protection circuit comprises: a first operational amplifier circuit connected to the output terminal of the power supply circuit for performing amplifying treatment of the first voltage, and a second operational amplifier circuit connected to the first operational amplifier circuit for performing comparison feedback of the amplified first voltage, such that a first protection voltage outputted by the first operational amplifier circuit lies within a preset range; and
   an output regulator circuit connected to the overvoltage protection circuit for regulated output of a second protection voltage.

2. The protection circuit according to claim 1, wherein the first operational amplifier circuit comprises:
   a first operational amplifier, comprising a positive input terminal, a negative input terminal and an output terminal, the positive input terminal being connected to the output terminal of the power supply circuit, and the negative input terminal being electrically grounded; and
   a first resistor, comprising a first terminal and a second terminal, the first terminal being connected to the output terminal of the power supply circuit, and the second terminal being connected to the output terminal of the first operational amplifier.

3. The protection circuit according to claim 2, wherein the second operational amplifier circuit comprises:
a diode, comprising a first terminal and a second terminal, the first terminal being connected to the positive input terminal of the first operational amplifier;
a second operational amplifier, comprising a positive input terminal, a negative input terminal and an output terminal, the positive input terminal being connected to the output terminal of the first operational amplifier, the output terminal being connected to the second terminal of the diode, and the negative input terminal being electrically grounded through a first voltage regulator tube;
a second resistor, comprising a first terminal and a second terminal, the first terminal being connected to the output terminal of the second operational amplifier, and the second terminal being connected to the negative input terminal of the second operational amplifier; and
a third resistor, comprising a first terminal and a second terminal, the first terminal being connected to the negative input terminal of the second operational amplifier, and the second terminal being connected to a power supply.

4. The protection circuit according to claim 1, wherein the filter circuit comprises:
a fourth resistor, comprising a first terminal and a second terminal, the first terminal being connected to the rectifier, and the second terminal being connected to an input terminal of the overvoltage protection circuit; and
a first capacitor, comprising a first terminal and a second terminal, the first terminal being grounded, and the second terminal being connected to the second terminal of the fourth resistor.

5. The protection circuit according to claim 1, wherein the output regulator circuit comprises:
a triode, comprising a collector electrode, a base electrode and an emitter electrode, the collector electrode being connected to an output terminal of the overvoltage protection circuit, and the base electrode being electrically grounded through a second voltage regulator tube;
a second capacitor, comprising a first terminal and a second terminal, the first terminal being connected to the emitter electrode, and the second terminal being grounded; and
a fifth resistor, comprising a first terminal and a second terminal, the first terminal being connected to the collector electrode, and the second terminal being connected to the base electrode.

6. The protection circuit according to claim 3, wherein the power supply has a voltage of 5V.

7. The protection circuit according to claim 1, wherein the first protection voltage is within a preset range of 0V to 5V.

8. A protection circuit, wherein the protection circuit comprises:
a power supply circuit for outputting a first voltage;
an overvoltage protection circuit connected to the power supply circuit for feedback regulation of the first voltage, such that a first protection voltage outputted by the overvoltage protection circuit is maintained within a preset range; and
an output regulator circuit connected to the overvoltage protection circuit for regulated output of a second protection voltage;
wherein the overvoltage protection circuit comprises:
a first operational amplifier circuit connected to an output terminal of the power supply circuit for performing amplifying treatment of the first voltage; and
a second operational amplifier circuit connected to the first operational amplifier circuit for performing comparison feedback of the amplified first voltage, such that a first protection voltage outputted by the first operational amplifier circuit lies within a preset range.

9. The protection circuit according to claim 8, wherein the first operational amplifier circuit comprises:
a first operational amplifier, comprising a positive input terminal, a negative input terminal and an output terminal, the positive input terminal being connected to the output terminal of the power supply circuit, and the negative input terminal being electrically grounded; and
a first resistor, comprising a first terminal and a second terminal, the first terminal being connected to the output terminal of the power supply circuit, and the second terminal being connected to the output terminal of the first operational amplifier.

10. The protection circuit according to claim 9, wherein the second operational amplifier circuit comprises:
a diode, comprising a first terminal and a second terminal, the first terminal being connected to the positive input terminal of the first operational amplifier;
a second operational amplifier, comprising a positive input terminal, a negative input terminal and an output terminal, the positive input terminal being connected to the output terminal of the first operational amplifier, the output terminal being connected to the second terminal of the diode, and the negative input terminal being electrically grounded through a first voltage regulator tube;
a second resistor, comprising a first terminal and a second terminal, the first terminal being connected to the output terminal of the second operational amplifier, and the second terminal being connected to the negative input terminal of the second operational amplifier; and
a third resistor, comprising a first terminal and a second terminal, the first terminal being connected to the negative input terminal of the second operational amplifier, and the second terminal being connected to a power supply.

11. The protection circuit according to claim 8, wherein the power supply circuit comprises:
a transformer, comprising an input terminal and an output terminal, the input terminal being connected to a utility frequency power supply for performing voltage transformation of the utility frequency power supply;
a rectifier, comprising a first input terminal, a second input terminal, a first output terminal and a second output terminal, wherein the first input terminal and the second input terminal are connected to the output terminal of the transformer for converting a voltage outputted by the transformer to a DC voltage; and
a filter circuit, comprising an input terminal and an output terminal, wherein the input terminal is connected to the first output terminal and the second output terminal of the rectifier for filtering the DC voltage.

12. The protection circuit according to claim 11, wherein the filter circuit comprises:
a fourth resistor, comprising a first terminal and a second terminal, the first terminal being connected to the rectifier, and the second terminal being connected to an input terminal of the overvoltage protection circuit; and a first capacitor, comprising a first terminal and a second terminal, the first terminal being grounded, and the second terminal being connected to the second terminal of the fourth resistor.

13. The protection circuit according to claim 8, wherein the output regulator circuit comprises:
   a triode, comprising a collector electrode, a base electrode and an emitter electrode, the collector electrode being connected to an output terminal of the overvoltage protection circuit, and the base electrode being electrically grounded through a second voltage regulator tube;
   a second capacitor, comprising a first terminal and a second terminal, the first terminal being connected to the emitter electrode, and the second terminal being grounded; and
   a fifth resistor, comprising a first terminal and a second terminal, the first terminal being connected to the collector electrode, and the second terminal being connected to the base electrode.

14. The protection circuit according to claim 10, wherein the power supply has a voltage of 5V.

15. The protection circuit according to claim 8, wherein the first protection voltage is within a preset range of 0V to 5V.

16. A display panel, wherein the display panel is connected to a protection circuit configured to power the display panel, the protection circuit comprising:
   a power supply circuit for outputting a first voltage;
   an overvoltage protection circuit connected to the power supply circuit for feedback regulation of the first voltage, such that a first protection voltage outputted by the overvoltage protection circuit is maintained within a preset range; and
   an output regulator circuit connected to the overvoltage protection circuit for regulated output of a second protection voltage;
   wherein the overvoltage protection circuit comprises:
   a first operational amplifier circuit connected to an output terminal of the power supply circuit for performing amplifying treatment of the first voltage; and
   a second operational amplifier circuit connected to the first operational amplifier circuit for performing comparison feedback of the amplified first voltage, such that a first protection voltage outputted by the first operational amplifier circuit lies within the preset range.

17. The display panel according to claim 16, wherein the first operational amplifier circuit comprises:
   a first operational amplifier, comprising a positive input terminal, a negative input terminal and an output terminal, the positive input terminal being connected to the output terminal of the power supply circuit, and the negative input terminal being electrically grounded; and
   a first resistor, comprising a first terminal and a second terminal, the first terminal being connected to the output terminal of the power supply circuit, and the second terminal being connected to the output terminal of the first operational amplifier.

18. The display panel according to claim 17, wherein the second operational amplifier circuit comprises:
   a diode, comprising a first terminal and a second terminal, the first terminal being connected to the positive input terminal of the first operational amplifier;
   a second operational amplifier, comprising a positive input terminal, a negative input terminal and an output terminal, the positive input terminal being connected to the output terminal of the first operational amplifier, the output terminal being connected to the second terminal of the diode, and the negative input terminal being electrically grounded through a first voltage regulator tube;
   a second resistor, comprising a first terminal and a second terminal, the first terminal being connected to the output terminal of the second operational amplifier, and the second terminal being connected to the negative input terminal of the second operational amplifier; and
   a third resistor, comprising a first terminal and a second terminal, the first terminal being connected to the negative input terminal of the second operational amplifier, and the second terminal being connected to a power supply.

* * * * *